United States Patent [19]

Marinace et al.

[11] Patent Number: 4,524,126
[45] Date of Patent: Jun. 18, 1985

[54] ADHESION OF A PHOTORESIST TO A SUBSTRATE

[75] Inventors: John C. Marinace; Ralph C. McGibbon, both of Yorktown Heights, N.Y.

[73] Assignee: International Business Machines Corporation, Armonk, N.Y.

[21] Appl. No.: 678,389

[22] Filed: Dec. 7, 1984

Related U.S. Application Data

[63] Continuation of Ser. No. 280,150, Jun. 30, 1981, abandoned.

[51] Int. Cl.³ .............................................. G03C 5/00
[52] U.S. Cl. .................................... 430/311; 430/271; 430/272; 430/275; 430/313; 430/317; 430/319
[58] Field of Search ............... 430/271, 272, 273, 275, 430/311, 313, 317, 319; 428/815

[56] References Cited

U.S. PATENT DOCUMENTS

| | | | |
|---|---|---|---|
| 3,482,977 | 12/1969 | Baker | 96/36.2 |
| 3,542,551 | 11/1970 | Rice | 96/36.2 |
| 3,549,368 | 12/1970 | Collins et al. | 96/35.1 |
| 3,615,465 | 10/1971 | Bullinger et al. | 430/313 |
| 3,716,390 | 2/1973 | Carbarini | 117/34 |
| 3,867,148 | 2/1975 | O'Keeffe et al. | 430/313 |
| 3,867,193 | 2/1975 | Sumi | 430/313 |
| 3,911,169 | 10/1975 | Lesaicherre et al. | 427/96 |
| 4,169,746 | 10/1979 | Ipri et al. | 148/175 |
| 4,224,400 | 9/1980 | Koel et al. | 430/319 |
| 4,288,283 | 9/1981 | Umezaki et al. | 430/313 |
| 4,310,569 | 1/1982 | Harrington | 430/313 |

FOREIGN PATENT DOCUMENTS 857823  12/1970  Canada .

OTHER PUBLICATIONS

IBM Technical Disclosure Bulletin, vol. 9, No. 1, Jun. 1966, Schwariz, C. G.
IBM Technical Disclosure Bulletin, vol. 9, No. 1, Jun. 1966, Krongelb, S.

Primary Examiner—Jack P. Brammer
Attorney, Agent, or Firm—Pollock, Vande Sande & Priddy

[57] ABSTRACT

A process for improving the adhesion of a photoresist to a substrate by applying a layer of titanium, zirconium, hafnium and/or oxide thereof between the photoresist and substrate.

20 Claims, 16 Drawing Figures

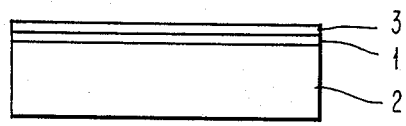
FIG. 1.1
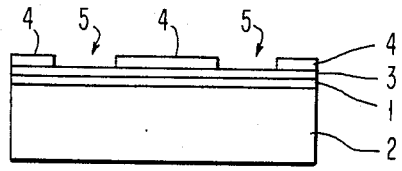
FIG. 1.2
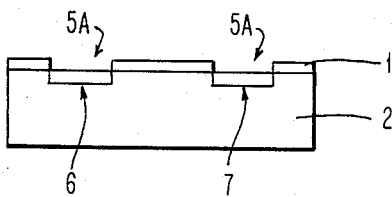
FIG. 1.3
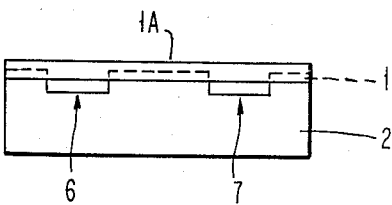
FIG. 1.4
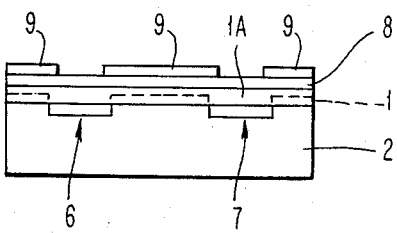
FIG. 1.5

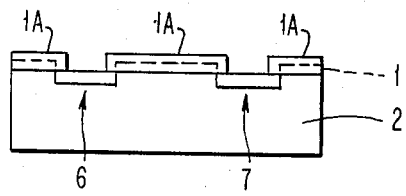
FIG. 1.6
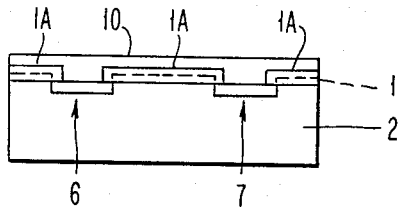
FIG. 1.7
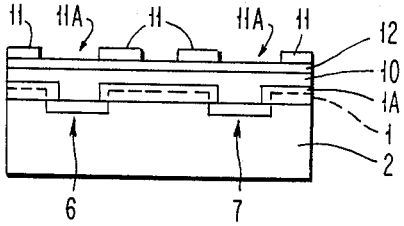
FIG. 1.8
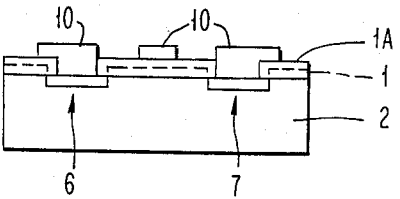
FIG. 1.9
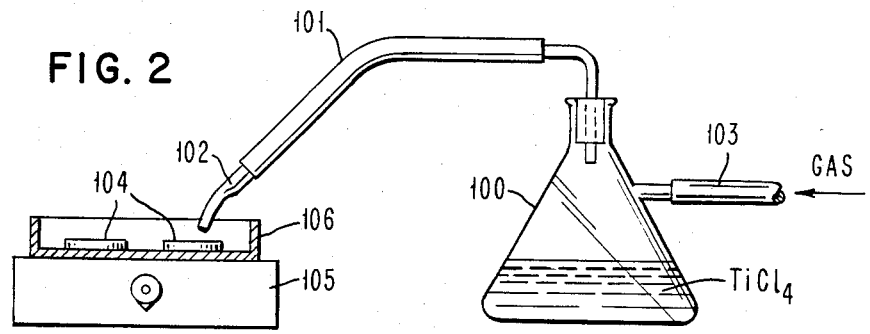
FIG. 2

ADHESION OF A PHOTORESIST TO A SUBSTRATE

This application is a continuation, of application Ser. No. 280,150, filed June 30, 1981, now abandoned.

DESCRIPTION

1. Technical Field

The present invention is directed to a process for fabricating a semiconductor device and is especially directed to improving the adhesion of the photoresist to the underlying substrate and particularly the semiconductor body.

2. Background Art

In the fabrication of various articles, it is often necessary to protect preselected areas of the surface while other areas of that same surface are exposed to particular treatments and/or process procedures. For instance, in the fabrication of semiconductor devices wherein, for example, an oxide layer is formed on a semiconductor substrate, it is often necessary to remove selected portions of the oxide layer so as to allow diffusion of a suitable impurity through the oxide layer openings into the underlying semiconductor substrate. Exemplary of such procedures is the fabrication of semiconductor devices, such as single crystal field effect transistors.

The above type of devices are formed by vapor diffusing a suitable impurity into a wafer of a single silicon crystal to form suitably doped regions therein. In order to provide distinct P or N regions; however, which are necessary for the proper operation of the device, diffusion should occur through only a limited portion of the substrate. Usually, this is accomplished by masking the substrate with a diffusion resistant material, such as silicon dioxide, which is formed into a protective mask to prevent diffusion through preselected areas of the substrate.

The silicon dioxide mask is typically provided by forming a uniform oxide layer over the wafer substrate and thereafter creating a series of openings through the oxide layer to allow the passage of the impurity directly into the underlying surface within a limited area. These openings are readily created by coating the silicon dioxide with a material known as a photoresist. Photoresists can be negative photoresist or positive photoresist materials. A negative photoresist material is one which is capable of polymerizing and insolubilizing on exposure to light. Accordingly, when employing a negative photoresist material, the photoresist layer is selectively exposed to light, causing polymerization to occur above those regions of the silicon dioxide which are intended to be protected during a subsequent operation. The unexposed portions of the photoresist are removed by a solvent which is inert to the polymerized portion of the resist and a suitable etchant for the silicon dioxide, such as hydrogen fluoride, is applied to remove the unprotected oxide regions.

The positive resist material is one that upon exposure to light is capable of being rendered soluble in a solvent in which the unexposed resist is not soluble. Accordingly, when employing a positive photoresist material, such is selectively exposed to light, causing reaction to occur above those regions of the silicon oxide which are not intended to be protected during the subsequent processing. The exposed portions of the photoresist are removed by a solvent which is not capable of dissolving the unexposed portion of the resist. Then a suitable etchant for the silicon dioxide, such as hydrogen fluoride, is applied to remove the unprotected oxide regions.

In developing the photoresist pattern, the photoresist intended to remain often lifts at the edges, especially if the humidity is high; thereby, exposing additional areas of the silicon surface to the impurity diffusion and creating deleteriously indistinct P- or N-type regions junctions. The resulting semiconductor devices are, therefore, characterized by significantly decreased output relative to that which theoretically could be provided. Moreover, since in field effect transistors at least two openings must be created through the oxide surface corresponding to the source and drain region of the device, there are at least four edges whose lack of resolution will influence the width of the source and drain and, more importantly, the width of the gate lying between the source and drain. Also, since the impurity tends to spread after entering the silicon body and since two separate diffusion regions are being generated simultaneously, the probability of shorting within the device, especially if narrow gate widths are desired, becomes increasingly more probable as the lack of resolution increases.

Recognizing this problem, the art with respect to negative photoresist proposed heating the photoresist prior to etching, such as by post-baking, in an attempt to provide a more adherent bond between the silicon dioxide surface and the resist. Post-baking has not been entirely satisfactory, since among other things, its effectiveness is largely dependent on the particular oxide surface being treated and on the surface conditions of that oxide surface, such as whether it contains impurities or moisture. Also, the normal variations in the oxide thickness results in certain layers being exposed to the etching solution longer than others, thereby accentuating the degree of resist, curling and lifting, and requiring a greater degree of post-baking in some regions than in others for the same substrate. Also, after the treating of the selected portions of the surface, the post-baked photoresist is often more difficult to remove than one which has not been post-baked. Accordingly, post-baking has not been a completely satisfactory procedure.

It has also been suggested to precoat the silicon dioxide layer with an adhesive composition which would inherently bond the photoresist to the silicon dioxide substrate. Various adhesive compositions have been proposed but have not been entirely satisfactory. Many, although having suitable bonding abilities, are considered generally toxic and highly reactive with air and moisture and often also require some degree of post-baking.

One of the more conventional ways to alleviate this problem now is to provide a liquid hexaalkyldisilazane adhesive on a substrate just before the photoresist is applied thereto. Although hexaalkyldisilazanes significantly improve the adhesion, such are somewhat limited when the strips to be defined become very narrow and/or the humidity in the processing becomes relatively high, such as above about 40%.

DISCLOSURE OF INVENTION

It has been found, according to the present invention, that poor adhesion, even when employing narrow strips such as about 2 microns or less and even in the presence of relatively high humidity, such as about 40% and above, can be overcome. It has been found, according to the present invention, that the photoresist material can be firmly and adherently bound to the desired substrate by means of a adhesive composition which prevents "curling" or lifting of the photoresist from the substrate and, consequently, prevents undercutting of the substrate during etching. Accordingly, the present invention can be especially adapted for fabricating semiconductor devices having a high output capability and having a high degree of gate and source resolution.

In particular, the adhesion between the photoresist and desired surface is enhanced by providing a layer of a material from the group of titanium, zirconium, hafnium or oxides thereof such as titanium dioxide, zirconium dioxide; or mixtures thereof between the photoresist and the surface. In addition, the adhesion-promoting layer and especially titanium dioxide, is readily etchable in buffered HF or hot phosphoric acid, and accordingly, does not interfere with the usual etching procedures employed.

BRIEF DESCRIPTION OF THE DRAWINGS

FIGS. 1.1–1.9 illustrate a sequence for fabricating field effect transistors according to the process of the present invention. For simplicity, only an MOS-type field effect transistor has been depicted.

FIG. 2 is a schematic diagram of an apparatus suitable for carrying out the coating operation according to the present invention.

DESCRIPTION OF BEST AND VARIOUS MODES FOR CARRYING OUT INVENTION

Figure 3:
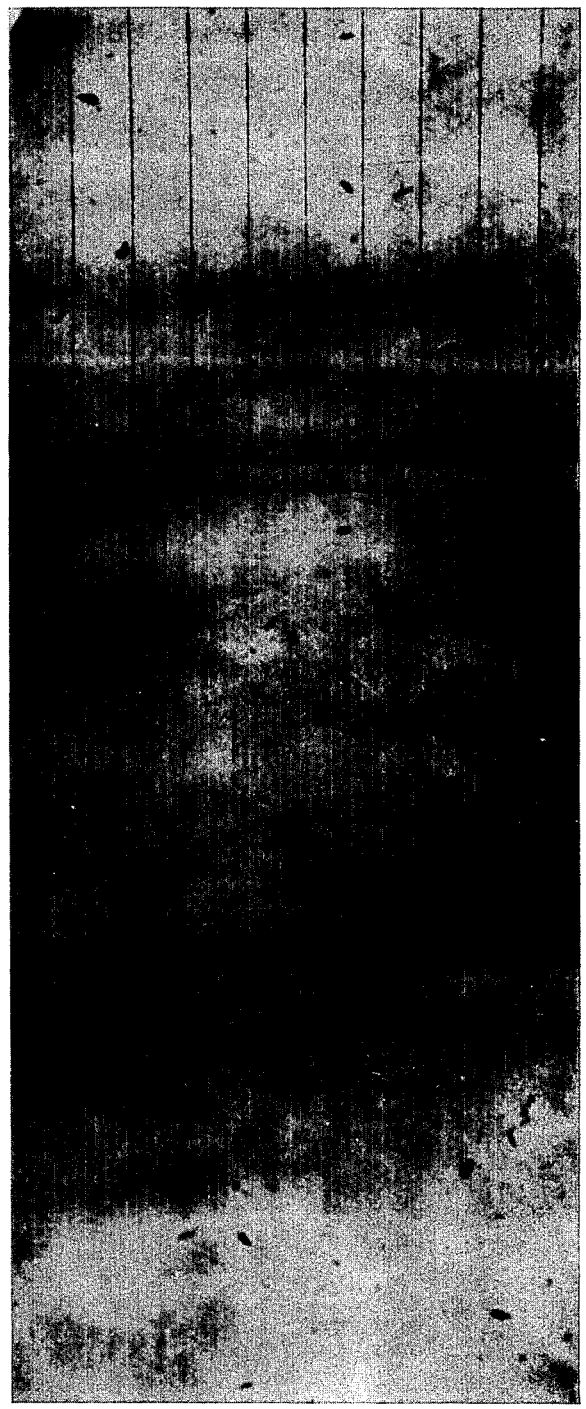
FIGS. 3–8 are copies of photographs comparing the present invention to untreated surfaces and surfaces treated with hexamethyldisilazane on various substrates.

To facilitate understanding the present invention, reference can be made to fabrication of a semiconductor device in which a silicon dioxide layer 1 is provided on a single crystal silicon wafer substrate 2 of FIG. 1.1. The silicon dioxide layer can be formed by any of the well-known techniques, such as evaporation of silicon dioxide onto the silicon substrate, thermal oxidation of the silicon surface with oxygen, water moisture, air or other oxidizing medium or thermal decomposition of siloxane or the like.

The thickness of the oxide may vary from a few hundred angstroms to many hundreds of thousands of angstroms depending upon the oxidation step or particular purpose for which the oxide is formed.

In addition, although reference is being made to a silicon dioxide layer, the present invention is applicable to semiconductor substrates in general, silicon-containing substrates, and any substrate which the problem of adhesion of the photoresist occurs. Of course, there are a few substrates in which such does not occur, such as with sapphire substrates. Specific examples of some suitable semiconductor substrates include gallium arsenide, silicon, and polycrystalline silicon. In addition, exemplary of some silicon-containing substrates are glass, silicon dioxide, and silicon nitride.

One suitable method for forming a silicon dioxide surface is by oxidation of a silicon substrate at a temperature of about 800°–1100° C. in an oxygen or steam atmosphere for a period ranging from a few minutes to about 4 hours. After the oxide layer is formed, a thin coating 3 of the adhesion promoter is applied thereto.

The coating 3 employed according to the present invention can be titanium, zirconium, hafnium, oxides of these metals such as titanium dioxide, and zirconium dioxide, hafnium dioxide or mixtures of any of the above. The preferred coating is titanium dioxide.

The adhesive can be applied by any one of several common coating techniques. Such techniques include sputtering and electron beam evaporation. With respect to applying titanium dioxide films, such can be conveniently applied by hydrolysis of $TiCl_4$; the hydrolysis-pyrolysis of titanium tetraisopropoxide $Ti(OC_3H_7)_4$ such as discussed by Hardee et al, *Journal of American Electrochemical Society*, Vol. 122, No. 6, page 739, disclosure of which is incorporated herein by reference; and by sputtering. The preferred method of applying titanium dioxide is by the hydrolysis of $TiCl_4$.

A typical such process includes adding $TiCl_4$ into flask 100 (see FIG. 2) at room temperature and conveying the $TiCl_4$ through a length of Viton tubing 101 and then a glass nozzle 102. Viton is a copolymer of hexaflouropropylene and 1,1-difluoroethylene. A gas, such as $N_2$, $O_2$, or He is passed via conduit 103 into the flask and over the liquid $TiCl_4$ in the flask at about room temperature and conveys the $TiCl_4$ through the tubing 101 and glass nozzle 102. The gas stream exits the nozzle at about 5 cm distance from the wafers or substrates 104 in holder 106. The wafers are at a temperature of about room temperature to about 300° C., and preferably at about room temperature to about 100° C. When desired, the wafers are heated by use of a hot plate 105. The thickness of the $TiO_2$ layer is about 10 to about 3000 Å, and preferably about 25 Å. The time employed for coating, for instance, a 3×3 cm. wafer is about 2 to about 3 seconds at a temperature of about 100° C. and about 5 seconds when the substrate is at room temperature.

As discussed hereinabove, the film can be deposited by, for instance, by the hydrolysis-pyrolysis of titanium tetraisopropoxide by employing the same type of equipment as discussed hereinabove for the process employing $TiCl_4$, except that the titanium tetraisopropoxide is placed in flask 100 and is heated to a temperature of about 65° to about 85° C. In addition, the temperature of the wafer substrate is generally about 350° C.

A sputtering technique can be carried out, for instance, using a titanium target and a gas of about 100% oxygen at 20 microns with a −2000 volt cathode with the substrates at −50 volts and about 33 mm distance apart. The temperature of the substrate wafer is about 150° C., providing about a 45 Å per minute growth rate.

After the adhesive promotion layer is deposited, a suitable photoresist material 4 (see FIG. 1.2) is then applied over the adhesive layer 3. A wide variety of photoresist materials can be inherently found by the techniques of the present invention. Among those photoresist materials found to be especially suitable include compositions based on phenol formaldehyde novalak polymers. A particular example of such is Shipley 1350 which is an m-cresol formaldehyde novalak polymer composition. Such is a positive resist composition and includes therein a diazoketone, such as 2-diazo-1-naphthol-5-sulphonic acid ester. In such a composition, the ortho-diazoketone during the photochemical reaction is converted to a carboxylic acid. This, in turn, converts a neutral-organic soluble molecule (the phenolic polymer) to one that is readily soluble in weakly alkali aqueous developer solvents. The composition usually contains about 15% or so by weight of the diazoketone compound. In addition, in other systems, the diazoketone is actually attached directly to the polymer molecules. In such a system, as a result of the association between the polymer and the diketone, the solubility of the mixture in the alkaline developer is inhibited. The hydrophobic nature of the polymer further inhibits attack by the developer. On exposure to light, the diketone liberates a molecule of nitrogen and undergoes a molecular rearrangement to the alkali-soluble acid. Formation of the polar carboxyl groups in the exposed areas also renders the film less hydrophobic and, thus, more easily attacked by the aqueous alkaline developer solution. A discussion of photoresist materials can be found, for instance, in *Journal of the Electrochemical Society*, Vol. 125, No. 3, March 1980—Deckert et al, "Microlithography—Key to Solid-State Fabrication", pp. 45C-56C, disclosure of which is incorporated herein by reference.

The photoresist is generally applied in a thickness of about 1 to about 2 microns.

Of course, the thickness of the photoresist to be applied depends upon the particular photoresist used and upon the particular technique and purpose for applying the photoresist. The photoresist layer is subjected to a suitable light pattern so as to cause selective reaction which provides a source-drain pattern 5 of FIG. 1.2 on the silicon dioxide layer. The exposed regions of the photoresist are then removed with a suitable solvent, such as an aqueous alkaline solution. The exposed portions of the adhesion layer can then be removed by a suitable etchant. For instance, in the case of titanium dioxide, buffered HF can be employed. Also HCl, either concentrated or as a 50% diluted solution in water, will slowly etch titanium dioxide. However, it has been found that the HCl will also remove underlying SiO$_2$ if the titanium dioxide was deposited by the sputtering process discussed hereinabove or by the use of the tetraisopropoxide.

On the other hand when deposited using the TiCl$_4$ process, as discussed hereinabove, with substrate temperatures of room temperature to about 100° C. or higher, removal of underlying SiO$_2$ on the use of HCl does not occur. Etching in buffered HF provides the source openings 5A in the SiO$_2$ layer 1 of FIG. 1.3.

After stripping off the photoresist with a suitable solvent such as IRCL J100 from INDUST-RI-CHEM LABORATORY, an N-type diffusion can be carried out with phosphorus, arsenic, or antimony to form the source 6 and drain 7 regions with an undiffused region between them which will subsequently become the gate or conductor channel. Next, a second layer 1A of silicon dioxide of about 1000 to about 5000 Å thickness may be deposited over the surface, as illustrated in FIG. 1.4. For purposes of continuity, the two silicon dioxide layers 1 and 1A are differentiated from the other, although in actuality, they are continuous. A coating of titanium dioxide 8 is again applied over the silicon dioxide layer, such as using the TiCl$_4$ process discussed hereinabove. A photoresist layer 9, such as Shipley AZ 1350 is then formed over the adhesion layer, such as shown in FIG. 1.5. The silicon dioxide in the open portions of the pattern are etched as previously described with buffered HF, and the photoresist and titanium dioxide are then removed entirely which results in the structure shown in FIG. 1.6.

A metallic-type interconnection material 10, such as aluminum, is evaporated over the entire surface resulting in the structure illustrated in FIG. 1.7. Metallic-type interconnection refers to lines or strips of metal such as aluminum as well as to non-metallic materials, such as highly doped polysilicon or intermetallic silicides which, nevertheless, have electrical conductivities of the magnitude generally possessed by metals. Next, a layer of photoresist 11 is deposited and developed as shown in FIG. 1.8. In addition, if desired, the adhesion layer as employed hereinabove can also be employed between the photoresist material and the metallic-type interconnection material. The photoresist and, if present, the underlying adhesion promoter is developed as illustrated in FIG. 1.8. After developing the photoresist, the aluminum in the open portions of the photoresist pattern 11A is etched with a hydroxide solution resulting in the structure shown in FIG. 1.9.

While this invention has been described principally in terms of preparing semiconductor devices, it should be understood that its general applicability is to any process which requires adhering a photoresist material to an underlying substrate and particularly to a semiconductor substrate, metallic substrate, or silicon-containing substrate. For example, the techniques of this invention can be used for preparing printed circuit boards, flat film memory units, wherein a thin film is protected by an oxide surface, doped layer modules, gravure printing, wherein an oxide base is involved, preparation of photomasks in general for glass plate and many other uses.

To further illustrate the advantages of the present invention, reference is made to FIGS. 3-8. In particular, FIG. 3 illustrates 1.5 micron strips on 100 micron centers of developed photoresist wherein the substrate is a thermal silicon dioxide on silicon wafer.

Figure 4:
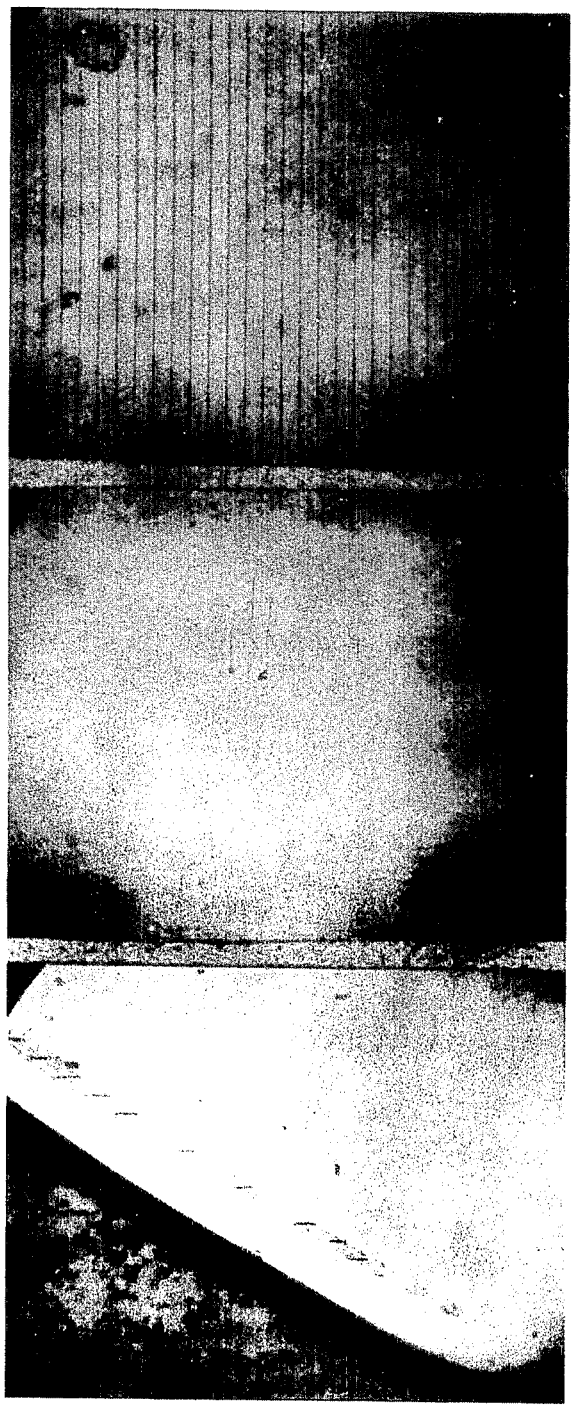

FIG. 4 represents 2.5 micron strips or 100 micron centers wherein the substrate is a silicon nitride layer on top of a silicon wafer.

Figure 5:
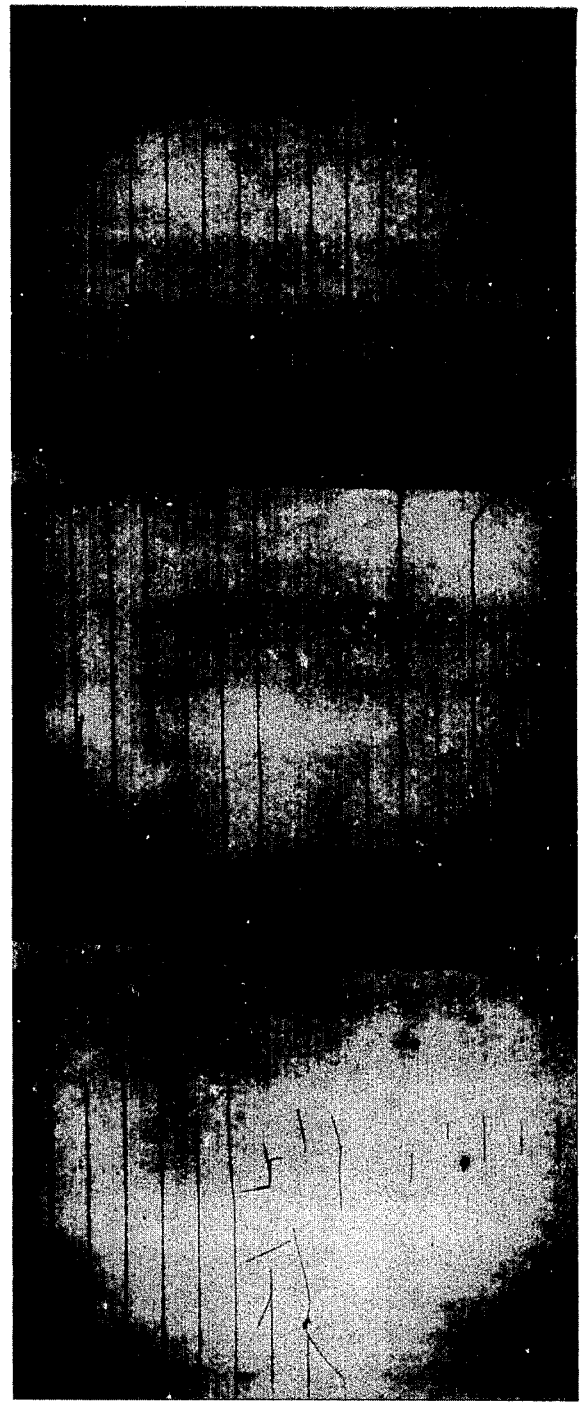

FIG. 5 represents 2.5 micron strips on 100 micron centers wherein the substrate is a silicon dioxide layer on a gallium arsenide substrate.

Figure 6:
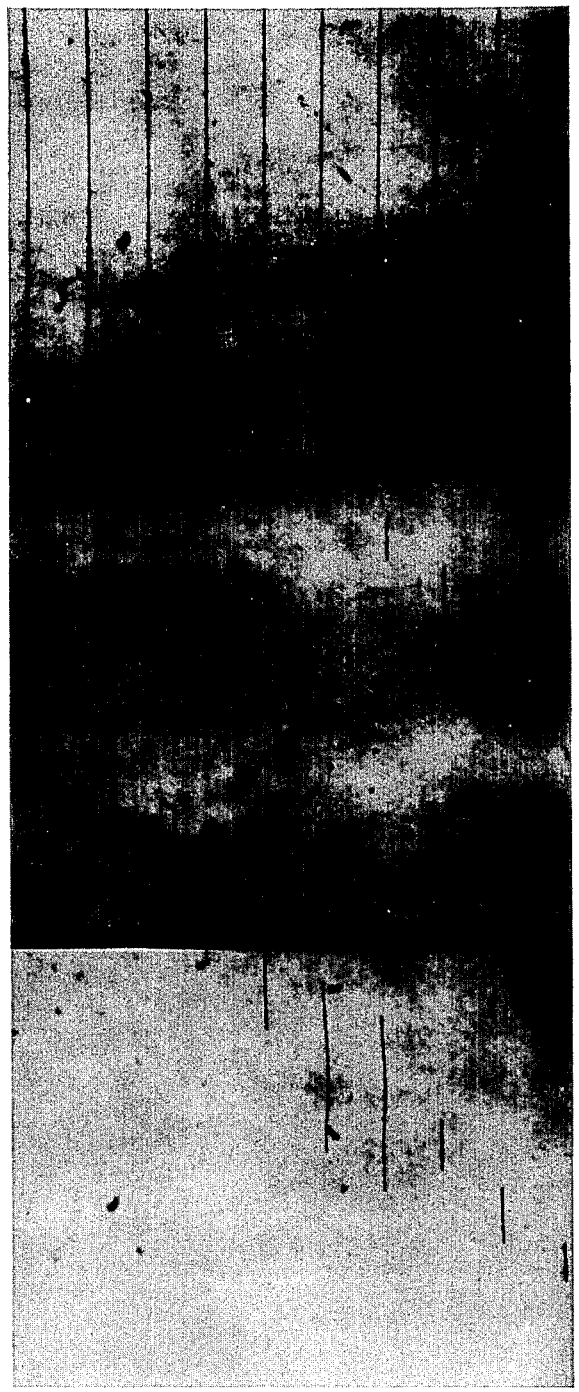

FIG. 6 represents 1.5 micron strips on 100 micron centers on a bare silicon surface.

Figure 7:
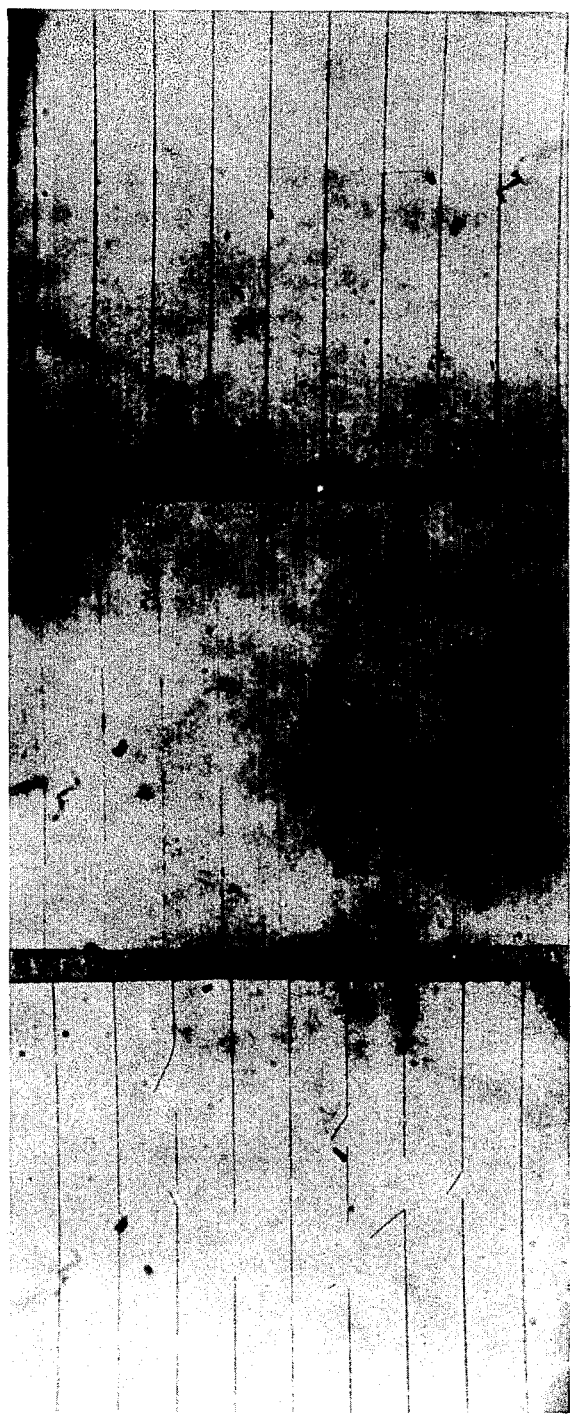

FIG. 7 represents 1.5 micron strips on 100 micron centers on a bare gallium arsenide substrate.

Figure 8:
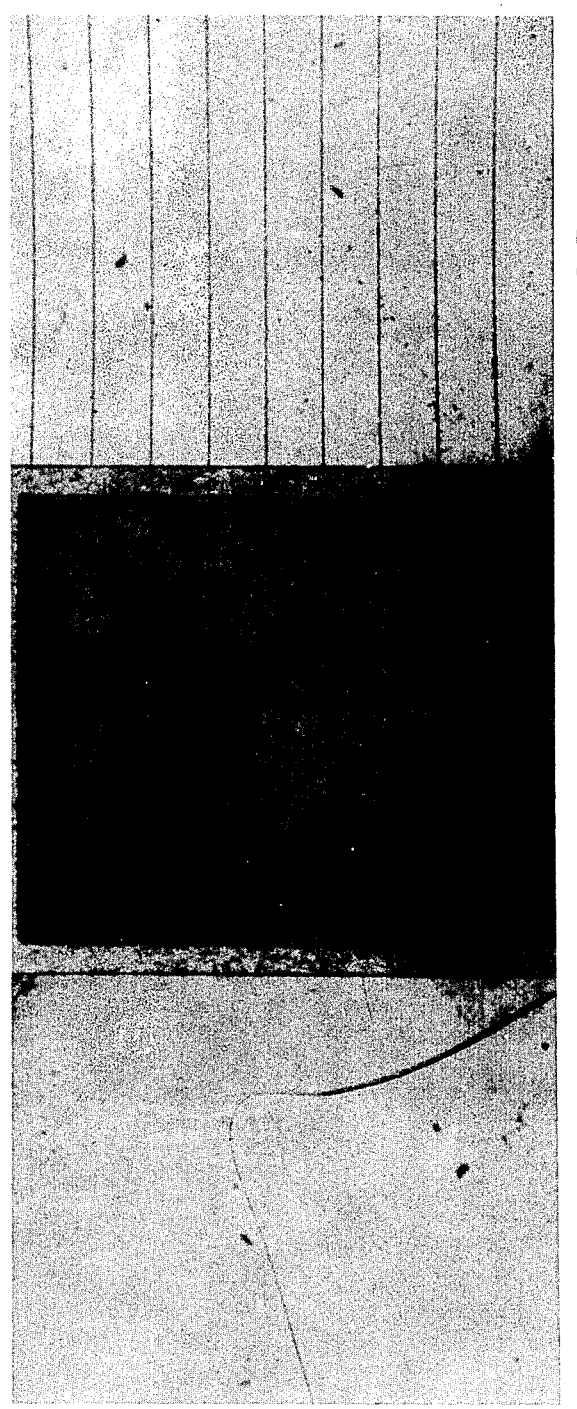

FIG. 8 represents 1.5 micron strips on 100 micron centers on a Corning cover glass substrate.

In all of the above FIGS. 3-8, 0.1 represents the untreated surface, 0.2 is a surface treated with hexamethyldisilazane in accordance with U.S. Pat. No. 3,549,368, and 0.3 represents titanium dioxide treated surface obtained by the process discussed hereinabove using TiCl$_4$ with the substrate at 100° C., except for FIG. 5.3 wherein the substrate was at room temperature.

As can be readily seen from the photographs of FIGS. 3-8, the present invention provides for much greater and improved adhesion of the photoresist to the substrate. The photoresist tested is Shipley AZ 1350 which is developed using Shipley AZ developer at about 44% relative humidity.

What is claimed is:

1. A process for fabricating a semiconductor device which comprises:
providing a layer about 10 to 3,000 Å thick selected from the group of zirconium, oxide thereof, oxide of titanium, oxide of hafnium, or a mixture thereof onto a surface selected from the group of gallium arsenide, silicon, polycrystalline silicon, glass, silicon dioxide, and silicon nitride; providing a photoresist on said layer; said layer enhancing the adhesion of said photoresist to said surface; wherein said photoresist is a positive photoresist material based on a formaldehyde novolak resin and a diazoketone; exposing said photoresist to desired image; developing the desired image by removing photoresist and said layer.

2. The process of claim 1 wherein said layer is selected from the group of titanium oxides, zirconium oxides, or mixtures thereof.

3. The process of claim 1 wherein said layer is an oxide of titanium.

4. The process of claim 1 which is carried out under relatively high humidity of about 40% relative humidity or above.

5. The process of claim 3 wherein the oxide of titanium is applied by hydrolysis of $TiCl_4$.

6. The process of claim 1 wherein said substrate is a semiconductor substrate.

7. The process of claim 1 wherein said substrate contains silicon.

8. The process of claim 1 wherein the substrate is silicon dioxide.

9. The process of claim 1 wherein said substrate is silicon nitride.

10. The process of claim 1 wherein said substrate is gallium arsenide.

11. The process of claim 1 wherein said substrate is glass.

12. The process of claim 1 wherein titanium dioxide is applied to the substrate which is at a temperature of about room temperature to about 300° C.

13. The process of claim 1 wherein the substrate during the application of the adhesion layer is at a temperature of about room temperature to about 100° C.

14. The process of claim 1 wherein the thickness of said layer is about 25 Å.

15. The process of claim 1 wherein all of said layer is removed subsequent to the exposing.

16. The process of claim 1 wherein said layer is an oxide of titanium; and said substrate is silicon-containing substrate.

17. The process of claim 16 wherein said substrate is silicon dioxide.

18. The process of claim 16 wherein the thickness of said layer is about 25 Å.

19. The process of claim 15 wherein said layer is an oxide of titanium; and said substrate is silicon-containing substrate.

20. The process of claim 1 wherein the thickness of the photoresist is about 1 to about 2 microns.

* * * * *